US009467131B2

(12) United States Patent
Lee et al.

(10) Patent No.: US 9,467,131 B2
(45) Date of Patent: Oct. 11, 2016

(54) DELAY CIRCUIT

(71) Applicant: GREEN SOLUTION TECHNOLOGY CO., LTD., New Taipei (TW)

(72) Inventors: Li-Min Lee, New Taipei (TW); Chao Shao, Wuxi (CN); Ying-Ying Yang, Wuxi (CN); Huan-Huan Zhang, Wuxi (CN)

(73) Assignee: GREEN SOLUTION TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 14/735,150

(22) Filed: Jun. 10, 2015

(65) Prior Publication Data

US 2016/0028386 A1    Jan. 28, 2016

(30) Foreign Application Priority Data

Jul. 24, 2014   (CN) .......................... 2014 1 0354714

(51) Int. Cl.
| | | |
|---|---|---|
| *H03L 7/06* | (2006.01) | |
| *H03K 5/14* | (2014.01) | |
| *H03K 5/00* | (2006.01) | |

(52) U.S. Cl.
CPC ....... *H03K 5/14* (2013.01); *H03K 2005/00019* (2013.01)

(58) Field of Classification Search
USPC .................................. 327/147–149, 156–158
See application file for complete search history.

(56) References Cited

U.S. PATENT DOCUMENTS

| | | | | | |
|---|---|---|---|---|---|
| 7,385,429 | B1* | 6/2008 | Mei | ....................... | H03L 7/0896 |
| | | | | | 327/148 |
| 8,040,168 | B2* | 10/2011 | Sakiyama | ............... | H02M 3/07 |
| | | | | | 327/148 |
| 2002/0017935 | A1* | 2/2002 | Soda | ..................... | H03L 7/0896 |
| | | | | | 327/157 |
| 2005/0162200 | A1* | 7/2005 | Haerle | .................. | H03L 7/0895 |
| | | | | | 327/157 |
| 2006/0220711 | A1* | 10/2006 | Sanduleanu | ............ | H03L 7/087 |
| | | | | | 327/157 |

(Continued)

FOREIGN PATENT DOCUMENTS

TW            I272611 B       2/2007

*Primary Examiner* — Adam Houston
(74) *Attorney, Agent, or Firm* — CKC & Partners Co., Ltd.

(57) ABSTRACT

A delay circuit includes a current circuit, a first current mirror circuit, a second current mirror circuit, a self-compensation circuit, and a delay capacitor. A fixed ratio is between the first current and the second current provided by the current circuit. The first current mirror circuit generates a first mirror current in response to the first current. A partial current of the second current flowing through the second current mirror circuit is a base current, and the second current mirror circuit generates a second mirror current in response to the base current. The self-compensation circuit generates a feedback current in response to the second mirror current. The delay capacitor generates a delay signal. The charging current is equal to the second current subtracting the base current. The first mirror current is the sum of the base current, the second mirror current, and the feedback current.

15 Claims, 4 Drawing Sheets

(56) References Cited

U.S. PATENT DOCUMENTS

| | | | |
|---|---|---|---|
| 2007/0075755 A1* | 4/2007 | Park | H03L 7/107 327/157 |
| 2007/0279114 A1* | 12/2007 | Holuigue | G05F 3/262 327/158 |
| 2008/0180144 A1* | 7/2008 | Mai | H03L 7/0812 327/157 |
| 2008/0197898 A1* | 8/2008 | Lin | H02M 3/07 327/157 |
| 2009/0121759 A1* | 5/2009 | Wang | H03L 7/0896 327/157 |
| 2012/0086482 A1* | 4/2012 | Maheshwari | H03L 7/0998 327/156 |
| 2013/0187691 A1* | 7/2013 | Sreekiran | H03H 11/04 327/157 |
| 2014/0153935 A1* | 6/2014 | Uo | H03L 7/183 398/202 |

* cited by examiner

DELAY CIRCUIT

RELATED APPLICATIONS

This application claims priority to Chinese Application Serial Number 201410354714.2, filed Jul. 24, 2014, which is herein incorporated by reference.

BACKGROUND

1. Field of Invention

The present invention relates to a delay circuit. More particularly, the present invention relates to a delay circuit capable of self-compensation.

2. Description of Related Art

Traditional delay circuits are mainly classified into two categories: digital controlled charging delay circuits and current charging delay circuits. FIG. 1 depicts a traditional circuit schematic diagram of a digital controlled charging delay circuit. An oscillator 10 periodically generates an oscillation signal Sclk to control turning-on and turning-off of a charging switch SW. The charging switch SW is connected to a charging current source 10 and a delay capacitor Cs. The charging current source 10 is connected to a driving voltage Vdd. A description is provided with reference to FIG. 1 and FIG. 2. FIG. 2 is waveform diagrams of an oscillation signal and a capacitance level. Whenever the charging switch SW is turned on, the charging current source 10 charges the delay capacitor Cs so that a level of a level signal Ss of the delay capacitor Cs jumps to a higher level. Whenever the charging switch SW is turned off, the level of the level signal Ss is maintained. A discharging switch Q0 is connected in parallel with the delay capacitor Cs to discharge the delay capacitor Cs when receiving a reset signal Senx so that the level of the level signal Ss returns to zero. A chip area required by the oscillator 10 is large, thus increasing the cost for chip area. In addition, the waveform of the level signal Ss will generate a step to a higher level when the delay capacitor Cs is charged. During the process, small overshoots tend to occur. Additionally, the chip tends to have an electric leakage phenomenon at a high temperature, which hinders the rise of the level of the level signal Ss.

FIG. 3 depicts a traditional circuit schematic diagram of a current charging delay circuit. The charging current source 10 is connected to the driving voltage Vdd and the delay capacitor Cs and provides a current to charge the delay capacitor Cs so that the level signal Ss continues to rise over time. The discharging switch Q0 is connected in parallel with the delay capacitor Cs to discharge the delay capacitor Cs while receiving the reset signal Senx so as to allow the level of the level signal Ss returns to zero. In order to generate a longer delay by a current charging delay circuit, a smaller current and a larger capacitor are required. However, an electric leakage phenomenon of the chip will occur or become significant at a high temperature so that a smaller current cannot initiate the system easily. For example, the level signal Ss serves as a soft boot signal. In addition, a larger capacitor will increase the chip cost.

FIG. 4 depicts a circuit schematic diagram of a delay circuit disclosed in TW Patent I272611. A current source 22 is connected between a driving voltage Vdd and a node 24 to supply a current I. A current mirror 26 comprises a transistor M1 and a transistor M2. The transistor M1 generates a current I1. The transistor M2 mirrors the current I1 to generate a current I2. Hence, a relationship for current is: I=I1+I2. A capacitor C is connected between the node 24 and the transistor M1 of the current mirror 26. A switch SW1 is connected between the node 24 and ground. When the switch SW1 is turned on, the capacitor C discharges to return to zero. When the switch SW1 is turned off, a current that charges the capacitor C is the current I1. A voltage level shift circuit 28 is connected to the node 24 for correcting a level of a voltage VA at the node 24.

A size ratio of the transistor M1 to the transistor M2 in the current mirror 26 is 1:N. The current I2 is thus calculated to be I2=N*I1. With such a circuit structure, an equivalent capacitance value of the capacitor C becomes (N+1) times. In other words, when compared with the above-mentioned delay circuits, an electric capacity of the capacitor C in this structure only needs to be 1/(N+1) of that of the above-mentioned delay circuits to achieve the same effect. Hence, the chip area required by the capacitor is greatly reduced.

Although it is claimed the phenomenon that the system cannot be initiated due to electric leakages of the transistors would not occur in the delay circuit shown in FIG. 4, a theoretical analysis does not indicate this. An illustration is provided as follows:

First, since the size ratio of the transistor M1 to the transistor M2 is 1:N, it means that the transistor M2 would have a leakage current of N*IX if the transistor M1 has a leakage current of IX. If the leakage current N*IX of the transistor M2 is greater than the current I, that is the leakage current IX of the transistor M1 is greater than the current I1, the delay circuit still cannot be initiated normally. In brief, when the leakage capability of a single transistor (the transistor M1 has one transistor, the transistor M2 has N transistors) is greater than the charging current (I1=1/(N+1)) of the capacitor C, the delay circuit will fail.

Second, the transistor M1 is usually connected in parallel with a transistor switch. The existence of the transistor switch will affect the delay time, or even cause the delay circuit to fail.

For the forgoing reasons, there is a need for to solve the above-mentioned problems by providing a delay circuit.

SUMMARY

The capacitor of the delay circuit according to the prior art requires a larger chip area. In addition, the prior art delay circuit is affected by the leakage current(s) so that the system cannot be initiated and the delay time is not accurate. The present invention provides a simpler delay circuit. By utilizing the self-compensation circuit, a smaller and more accurate charging current is generated so as to avoid the impact on the charging current by the leakage current(s). As a result, the advantages that the chip size is small and the delay action is accurate and does not tend to be affected by the leakage currents(s) are achieved.

A delay circuit is provided. The delay circuit comprises a current circuit, a first current mirror circuit, a second current mirror circuit, a self-compensation circuit, and a delay capacitor. The current circuit provides a first current and a second current, and a fixed ratio is between the first current and the second current. The first current mirror circuit is coupled to the current circuit and configured to generate a first mirror current in response to the first current. The second current mirror circuit is coupled between the current circuit and the first current mirror circuit. When a partial current of the second current flows through the second current mirror circuit defined as a base current, the second current mirror circuit generates a second mirror current in response to the base current. The self-compensation circuit is coupled to the second current mirror circuit and configured to generate a feedback current in response to the second mirror current. The delay capacitor is coupled to the second current mirror circuit and the current circuit for receiving a charging current to generate a delay signal. The charging current is equal to the second current subtracting the base current, and the first mirror current is a sum of the base current, the second mirror current, and the feedback current.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
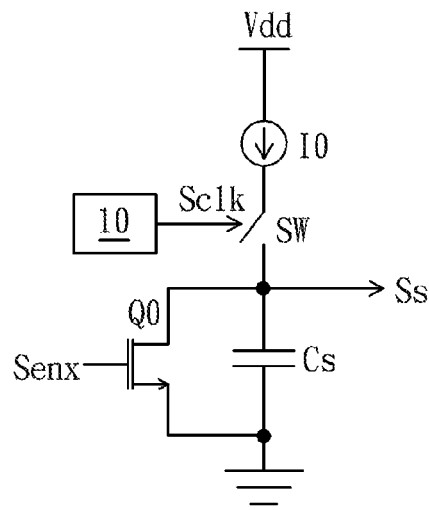
FIG. 1 depicts a circuit schematic diagram of a digital controlled charging delay circuit according to the prior art.
Figure 2:
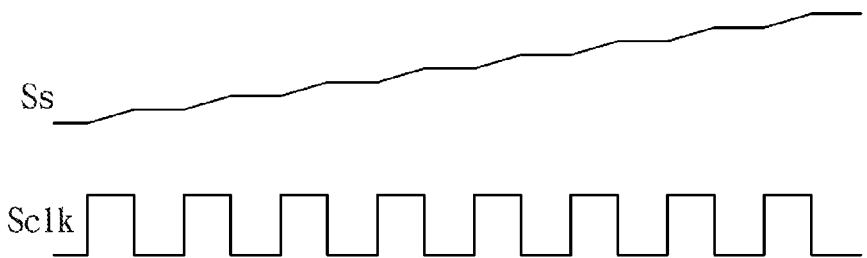
FIG. 2 is waveform diagrams of an oscillation signal and a capacitance level.
Figure 3:
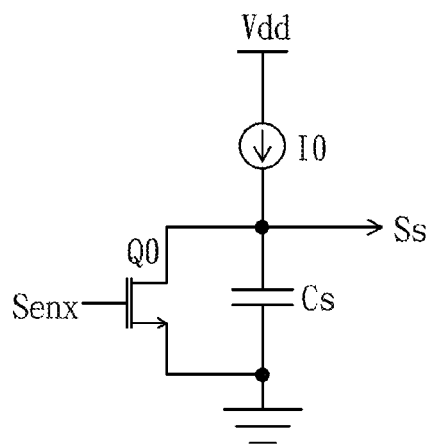
FIG. 3 depicts a circuit schematic diagram of a current charging delay circuit according to the prior art.

Reference will now be made in detail to the present embodiments of the invention, examples of which are illustrated in the accompanying drawings. Wherever possible, the same reference numbers are used in the drawings and the description to refer to the same or like parts.

Figure 5:
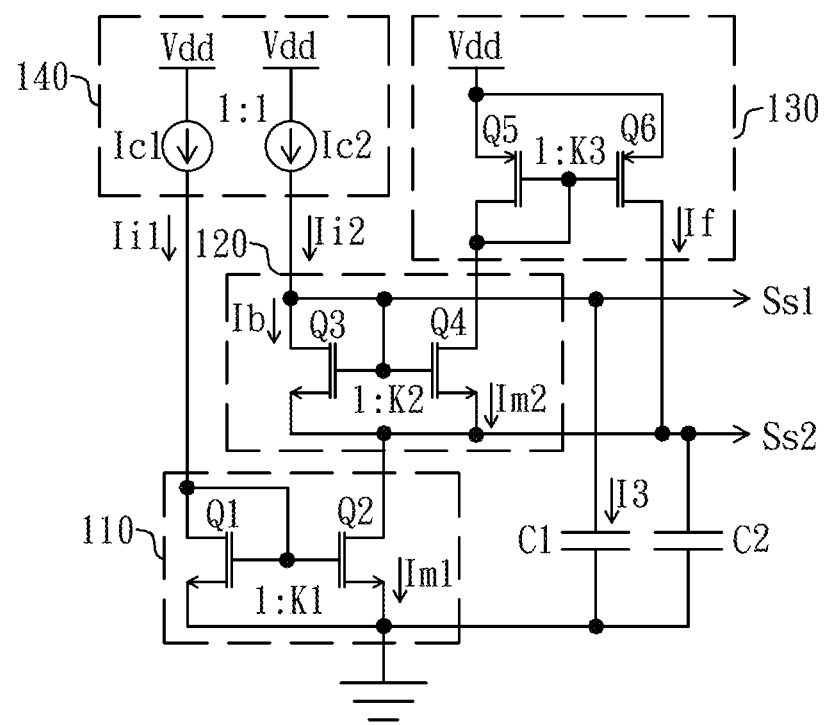
FIG. 5 depicts a circuit schematic diagram of a delay circuit according to a first embodiment of this invention.

FIG. 5 depicts a circuit schematic diagram of a delay circuit according to a first embodiment of this invention. A delay circuit comprises a first current mirror circuit 110, a second current mirror circuit 120, a self-compensation circuit 130, a delay capacitor C1, and a current circuit 140. The current circuit 140 is coupled to a driving voltage Vdd. The current circuit 140 comprises a first current source Ic1 and a second current source Ic2 for respectively providing a first current Ii1 and a second current Ii2. A fixed ratio is between the first current Ii1 and the second current Ii2. The ratio is 1:1 according to the present embodiment. The first current mirror circuit 110 is coupled to the current circuit 140 and generates a first mirror current Im1 in response to the first current Ii1 The second current mirror circuit 120 is coupled between the current circuit 140 and the first current mirror circuit 110. A partial current of the second current Ii2 flows through the second current mirror circuit 120 is defined as a basic current Ib. The second current mirror circuit 120 generates a second mirror current Im2 in response to the basic current Ib. The self-compensation circuit 130 is coupled to the second current mirror circuit 120 and generates a feedback current If in response to the second mirror current Im2. The delay capacitor C1 is coupled to the second current mirror circuit 120 and the current circuit 140 for receiving a charging current I3 to generate a delay signal Ss1. The charging current I3 is equal to the second current Ii2 subtracting the base current Ib, and the first mirror current Im1 is a sum of the base current Ib, the second mirror current Im2, and the feedback current If.

The first current mirror circuit 110 comprises a base transistor Q1 and a mirror transistor Q2. Gates of the base transistor Q1 and the mirror transistor Q2 are connected to each other. A source of the base transistor Q1 and a source of the mirror transistor Q2 are connected to each other and connected to ground. The gate of the base transistor Q1 is connected to a drain of the base transistor Q1 and the drain of the base transistor Q1 is also coupled to the first current source Ic1 of the current circuit 140 to receive the first current Ii1. The mirror transistor Q2 mirrors the first current Ii1 to generate the first mirror current Im1. A current mirror ratio of the first current mirror circuit 110 is K1, then Ii1*K1=Im1.

The second current mirror circuit 120 comprises a base transistor Q3 and a mirror transistor Q4. Gates of the base transistor Q3 and the mirror transistor Q4 are connected to each other. A source of the base transistor Q3 and a source of the mirror transistor Q4 are connected to each other and coupled to a drain of the mirror transistor Q2 in the first current mirror circuit 110. The gate of the base transistor Q3 is connected to a drain of the base transistor Q3 and the drain of the base transistor Q3 is also coupled to the second current source Ic2 of the current circuit 140 so that the partial current of the second current Ii2, that is the base current Ib, flows through the second current mirror circuit 120. The mirror transistor Q4 mirrors the base current Ib to generate the second mirror current Im2. A current mirror ratio of the second current mirror circuit 120 is K2, then Ib*K2=Im2.

The delay capacitor C1 is coupled to the second current source Ic2 and the drain of the base transistor Q3 to receive the charging current I3. Hence, the charging current I3 is equal to the second current Ii2 subtracting the base current Ib. The charging current I3 is a continuous current during the charging process. Thus, a level of the delay signal Ss1 generated by the delay capacitor C1 continues to rise over time during the charging process.

In the present embodiment, the self-compensation circuit 130 is a current mirror circuit. The self-compensation circuit 130 comprises a base transistor Q5 and a mirror transistor Q6. Gates of the base transistor Q5 and the mirror transistor Q6 are connected to each other. A source of the base transistor Q5 and a source of the mirror transistor Q6 are connected to each other and connected to the driving voltage Vdd. The gate of the base transistor Q5 is connected to a drain of the base transistor Q5 and the drain of the base transistor Q5 is also coupled to the mirror transistor Q4 of the second current mirror circuit 120 to receive the second mirror current Im2. The mirror transistor Q6 mirrors the second mirror current Im2 to generate the feedback current If. A ratio of the feedback current If to the second mirror current Im2 is K3. Therefore, the their relationship can be represented as: Im2*K3=If.

The mirror transistor Q6 is coupled to the source of the mirror transistor Q4. Therefore, according to Kirchhoff's Circuit Laws, the first mirror current Im1 is the sum of the base current Ib, the second mirror current Im2, and the feedback current If.

In addition, a buffer capacitor C2 may be added selectively. On terminal of the buffer capacitor C2 is connected to the self-compensation circuit 130 to generate a buffer signal Ss2. Another terminal is connected to ground. The addition of the buffer capacitor C2 allows the self-compensation effect of the self-compensation circuit 130 to be more stable. A partial current of the feedback current If is a buffer charging current for charging the buffer capacitor C2. Hence, a relationship for current under the circumstances is that a sum of the first mirror current Im1 and the buffer charging current is equal to the sum of the base current Ib, the second mirror current Im2, and the feedback current If.

Figure 6:
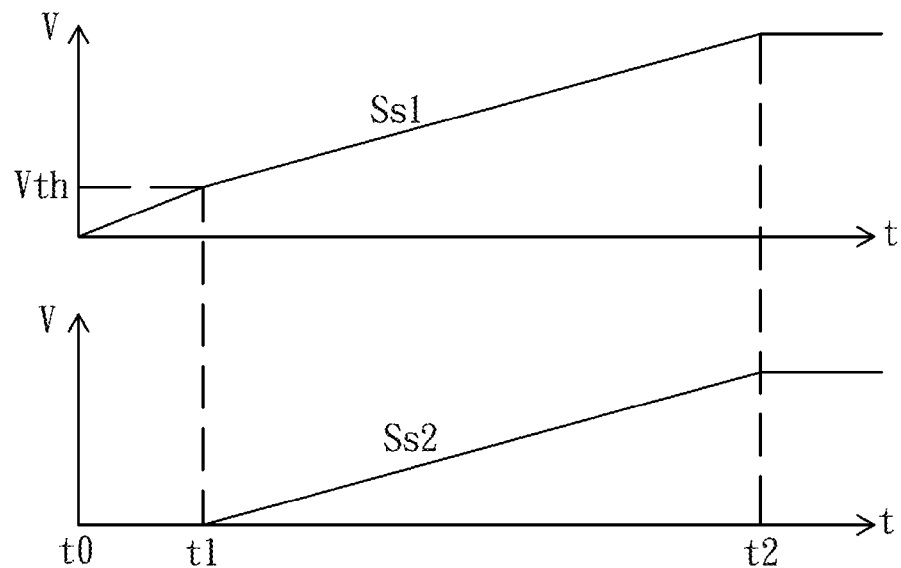
FIG. 6 is waveforms of a delay signal and a buffer signal of the delay circuit in FIG. 5.

Then, a description is provided with reference to FIG. 5 and FIG. 6. FIG. 6 is waveforms of the delay signal and the buffer signal of the delay circuit in FIG. 5. At time point t0, the self-compensation circuit 130 starts operating. The charging current I3 charges the delay capacitor C1 to allow the level of the delay signal Ss1 to rise from zero. Before a time point t1, since a voltage across an input terminal and an output terminal of the second current mirror circuit 120, that is a voltage across the drain (gate) of the base transistor Q3 and the source of the base transistor Q3, hasn't reached a conduction threshold voltage of the base transistor Q3. At this time, the base transistor Q3 is turned off. The base current Ib is zero. The charging current I3 is equal to the second current Ii2. At the same time, the second mirror current Im2 is also zero. The self-compensation circuit 130 stops operating. At the time point t1, when the level of the delay signal Ss1 rises to allow the voltage across the input terminal and the output terminal of the second current mirror circuit 120 to reach a predetermined level (that is, the conduction threshold voltage for the base transistor Q3), the second current mirror circuit 120 and the self-compensation circuit 130 start operating. During a period between the time point t1 and the time point t2, the base current Ib is not zero. Hence, the charging current I3 is smaller. A rising rate of the level of the delay signal Ss1 is lower than the rising rate of the level of the delay signal Ss1 before the time point t1. In addition, before the time point t1, the second current mirror circuit 120 hasn't started operating so that not any current is conducted. At this time, since the mirror transistor Q4 is turned on, the output terminal of the second current mirror circuit 120, that is the source of the base transistor Q3 and the source of the mirror transistor Q4, is forced to be zero. Thus, a level of the buffer signal Ss2 is zero before the time t1. At the time point t1, the second current mirror circuit 120 starts operating to maintain the voltage across the input terminal and the output terminal at approximately the conduction threshold voltage. A level difference between the level of the delay signal Ss1 and the level of the buffer signal Ss2 is thus maintained at around the conduction threshold voltage at this time.

Based on the above description, when the ratio of the first current Ii1 to the second current Ii2 is 1:1, the delay circuit shown in FIG. 5 satisfies the following conditions:

$$K1>(1+K2) \quad (1)$$

$$K1<(1+K2+K2*K3) \quad (2)$$

Condition (1) ensures that the level of the buffer signal Ss2 to be maintained at zero before the time point t1, that is when the level of the delay signal Ss1 is lower than the conduction threshold voltage. When the level of the delay signal Ss1 is higher than or equal to the conduction threshold voltage, the self-compensation circuit 130 starts operating. The delay circuit is therefore in a self-compensation feedback state. In the self-compensation feedback state, the base current Ib of the base transistor Q3 increases when the delay signal Ss1 rises. The feedback current If=K2*K3*Ib generated by the mirror transistor Q6 is thus increased so that the buffer signal Ss2 rises at a higher rate, which causes the level difference between the delay signal Ss1 and the buffer signal Ss2, that is the voltage across the gate-source of the base transistor Q3, to become smaller so as to inhibit the rise of the base current Ib. As a result, the self-compensation effect of the self-compensation circuit 130 can stabilize the current of the delay circuit to ensure the accuracy of the delay time of the delay circuit.

When the circuit is in the self-compensation feedback state, according to Kirchhoff's Circuit Laws, the current relationship can be expressed as:

$$Im1=Ii1*K1 \quad (3)$$

$$Im1=Ib+Im2+If=Ib*(1+K2+K2*K3) \quad (4)$$

$$I3=Ii2-Ib \quad (5)$$

According to the third equation and the fourth equation, it is obtained:

$$Ib=Ii1*K1/(1+K2+K2*K3)=Ii2*K1/(1+K2+K2*K3) \quad (6)$$

According to the fifth equation and the sixth equation, it is obtained:

$$I3=Ii2*(1-K1/(1+K2+K2*K3)) \quad (7)$$

According to the above condition (2), it is ensured that the charging current I3 is greater than zero. When K1 is smaller than and close to (1+K2+K2*K3), a significantly small charging current I3 is obtained to allow the level of the delay signal Ss1 to rise slowly. The level of the buffer signal Ss2 will rise slowly following the level of the delay signal Ss1.

Figure 4:
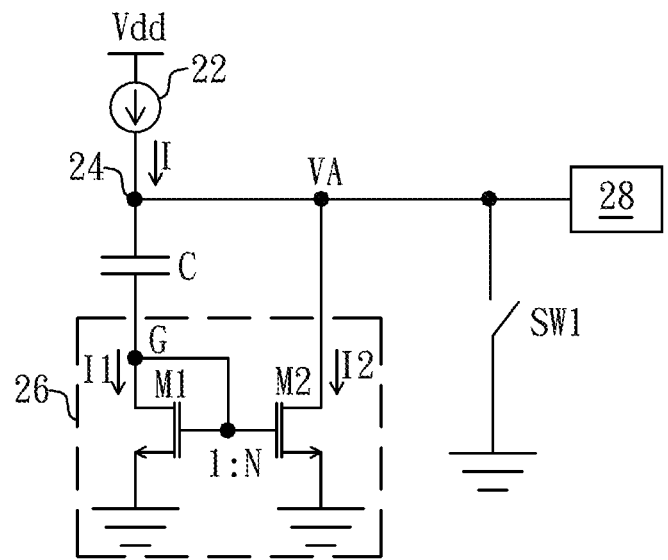
FIG. 4 depicts a circuit schematic diagram of a delay circuit disclosed in TW Patent I272611.

The present invention delay circuit does not tend to make the circuit fail easily because of the leakage current of the transistor. For example, if K1=6, K2=2, K3=2, the charging current is calculated to be I3=Ii2*1/7 and the base current is calculated to be Ib=6/7*Ii2 according to the seventh equation. Hence, the base current Ib is close to the second current Ii2. A current flowing from the drain to the source of the base transistor Q3 is Ii2*6/7−Ix if the leakage current IX existing between the drain and the base is IX. Under the circumstances that the base current Ib is close to the second current Ii2, the present invention delay circuit can further ensure that Ii2*6/7−Ix>0 as compared with the delay circuit according to the prior art shown in FIG. 4, that is, the normal operation of the second current mirror circuit 120 is maintained. In consideration of the charging current I3, the partial current of the second current Ii2 flowing through the second current mirror circuit 120 is still the base current Ib (comprises the leakage current of the base transistor Q3). Thus, the seventh equation will still stands. As a result, the leakage current neither tends to affect the normal initiation of the present invention delay circuit, nor will cause the delay time of the delay circuit too long.

Figure 7:
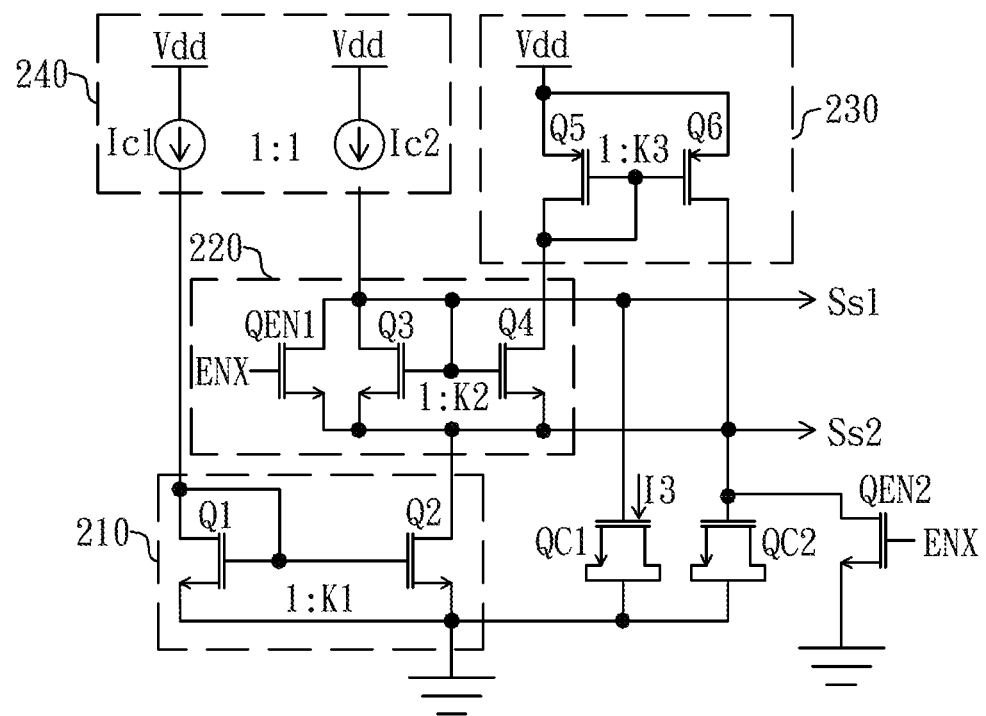
FIG. 7 depicts a circuit schematic diagram of a delay circuit according to a second embodiment of this invention.

FIG. 7 depicts a circuit schematic diagram of a delay circuit according to a second embodiment of this invention. A delay circuit comprises a first current mirror circuit 210, a second current mirror circuit 220, a self-compensation circuit 230, a delay capacitor QC1, and a current circuit 240. As compared with the embodiment shown in FIG. 5, a description as to the main difference is provided as follows. First, an enable transistor QEN1 is added to the second current mirror circuit 220. The enable transistor QEN1 is connected in parallel with the base transistor Q3 and is turned on or turned off according to an enable signal ENX. When the enable transistor QEN1 is turned on, the voltage difference between the gate-source of the base transistor Q3 of the second current mirror circuit 220 is zero. At this time, the second current mirror circuit 220 stops operating, and charges in the delay capacitor QC1 are released through the enable transistor QEN1 and the mirror transistor Q2 until reaching zero. As a result, the level of the delay signal Ss1 is also zero. When the enable transistor QEN1 is turned off, the voltage difference between the gate-source of the base transistor Q3 of the second current mirror circuit 120 starts to rise from zero following the charging of the delay capacitor C1. The detailed description corresponding to the embodiment shown in FIG. 5 may be referred to for an illustration. Users are allowed to control whether to initiate the delay circuit by way of the enable transistor QEN1.

In addition, an enable transistor QEN2 may be added and connected in parallel with a buffer capacitor QC2 so as to determined whether to discharge the buffer capacitor QC2 according to the enable signal ENX. When the enable transistor QEN2 is turned on, the buffer capacitor QC2 is discharged. At this time, the level of the buffer signal Ss2 is clamped at zero. Owing to the self-compensation effect of the self-compensation circuit 230, the level of the delay signal Ss1 is also clamped at the conduction threshold voltage so that the delay circuit is in a reset state. In practical applications, the function of enabling and disabling the delay circuit can be achieved when any or both of the enable transistors QEN1 and QEN2 exist.

Additionally, capacitance values required by the delay capacitor C1 and the buffer capacitor C2 can be very small according to the present invention. Therefore, in the present embodiment, the delay capacitor QC1 and the buffer capacitor QC2 are MOS capacitors.

Figure 8:
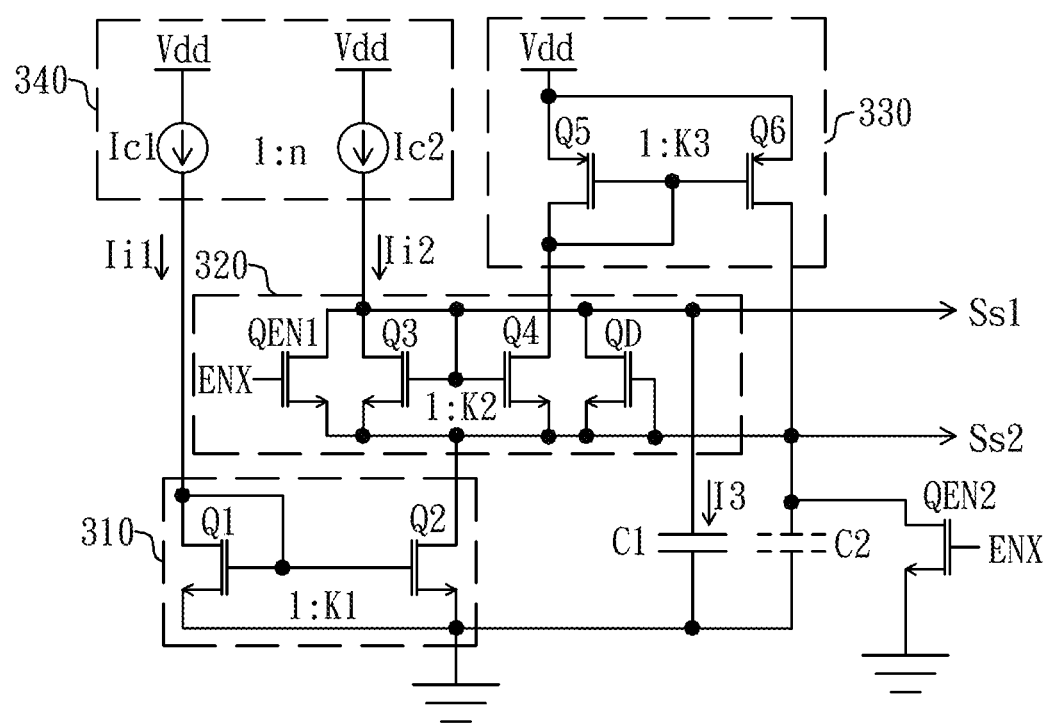
FIG. 8 depicts a circuit schematic diagram of a delay circuit according to a third embodiment of this invention.

FIG. 8 depicts a circuit schematic diagram of a delay circuit according to a third embodiment of this invention. A delay circuit comprises a first current mirror circuit 310, a second current mirror circuit 320, a self-compensation circuit 330, a delay capacitor C1, and a current circuit 340. As compared with the embodiment shown in FIG. 7, a description as to the main difference is provided as follows. First, a ratio of the first current Ii1 to the second current Ii2 of the current circuit 340 is: Ii1:Ii2=1:N. Under the circumstances, operating conditions of the delay circuit are revised as follows:

$$K1 > N*(1+K2) \quad (8)$$

$$K1 < N*(1+K2+K2*K3) \quad (9)$$

In addition, in order to reduce the impact on the delay circuit by the electric leakage of the enable transistor QEN1, a dummy transistor QD may be added correspondingly. The dummy transistor QD is connected in parallel with the mirror transistor Q4, and a size ratio of the dummy transistor QD to the enable transistor QEN1 is a fixed ratio K4. Under the circumstances, condition (9) is revised as follows:

$$N*(1+((K2+K4)+(K2+K4))*K3)/2 > K1$$

In this manner, it is ensured that the delay circuit will not fail due to the electric leakage of the enable transistor QEN1.

In summary, the present invention delay circuit can reduce chip area and provide a longer time delay effect. Additionally, the present invention delay circuit does not tend to be affected by the electric leakage(s) of transistor(s) so that the phenomenon that the circuit cannot be initiated due to electric leakage(s) at a high temperature will not occur. In addition to that, as compared with the prior art delay circuit shown in FIG. 4, the present invention delay circuit does not require a voltage level shift circuit to correct the signal level.

As described above, the present invention meets the three requirements of patentability, namely novelty, non-obviousness, and industrial applicability. All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A delay circuit comprising:
    a current circuit for providing a first current and a second current, a fixed ratio being between the first current and the second current;
    a first current mirror circuit coupled to the current circuit and configured to generate a first mirror current in response to the first current;
    a second current mirror circuit coupled between the current circuit and the first current mirror circuit, wherein a partial current of the second current flowing through the second current mirror circuit is a base current, and the second current mirror circuit generates a second mirror current in response to the base current;
    a self-compensation circuit coupled to the second current mirror circuit and configured to generate a feedback current in response to the second mirror current; and
    a delay capacitor coupled to the second current mirror circuit and the current circuit for receiving a charging current to generate a delay signal;
    wherein the charging current is equal to the second current subtracting the base current, and the first mirror current is a sum of the base current, the second mirror current, and the feedback current.

2. The delay circuit of claim 1, further comprising a buffer capacitor, the buffer capacitor being coupled to the self-compensation circuit, a partial current of the feedback current being a buffer charging current to charge the buffer capacitor, a sum of the first mirror current and the buffer charging current being equal to the sum of the base current, the second mirror current, and the feedback current.

3. The delay circuit of claim 2, further comprising an enable transistor coupled to the buffer capacitor, the enable transistor determining whether to discharge the buffer capacitor according to an enable signal.

4. The delay circuit of claim 1, wherein when a level of the delay signal rises so that a voltage across an input terminal and an output terminal of the second current mirror circuit reaches a predetermined level, the second current mirror circuit starts operating.

5. The delay circuit of claim 1, wherein the second current mirror circuit comprises a base transistor and a mirror transistor, the base transistor is coupled to the current circuit and the delay capacitor to allow the base current to flow through, the mirror transistor is coupled to the first current mirror circuit and generates the second mirror current.

6. The delay circuit of claim 5, wherein the second current mirror circuit further comprises an enable transistor connected in parallel with the base transistor, and the enable transistor determines whether to stop operating the second current mirror circuit according to an enable signal.

7. The delay circuit of claim 6, wherein the second current mirror circuit further comprises a dummy transistor connected in parallel with the mirror transistor.

8. The delay circuit of claim 7, wherein a current mirror ratio of the first current mirror circuit is K1, a current mirror ratio of the second current mirror circuit is K2, a ratio of the feedback current of the self-compensation circuit to the second mirror current is K3, a ratio of the second current to the first current is N, a size ratio of the dummy transistor to the enable transistor is K4, and the following condition is satisfied:

$$N*(1+((K2+K4)+(K2+K4))*K3)/2 > K1.$$

9. The delay circuit of claim 1, wherein the self-compensation circuit is a current mirror circuit for generating the feedback current by mirroring the second mirror current.

10. The delay circuit of claim 9, wherein a current mirror ratio of the first current mirror circuit is K1, a current mirror ratio of the second current mirror circuit is K2, a current mirror ratio of the self-compensation circuit is K3, a ratio of the second current to the first current is N, and the following conditions are satisfied:

$$K1 > N*(1+K2); \text{ and}$$

$$K1 < N*(1+K2+K2*K3).$$

11. The delay circuit of claim 2, wherein when a level of the delay signal rises so that a voltage across an input terminal and an output terminal of the second current mirror circuit reaches a predetermined level, the second current mirror circuit starts operating.

12. The delay circuit of claim 2, wherein the second current mirror circuit comprises a base transistor and a mirror transistor, the base transistor is coupled to the current circuit and the delay capacitor to allow the base current to flow through, the mirror transistor is coupled to the first current mirror circuit and generates the second mirror current.

13. The delay circuit of claim 12, wherein the second current mirror circuit further comprises an enable transistor connected in parallel with the base transistor, and the enable transistor determines whether to stop operating the second current mirror circuit according to an enable signal.

14. The delay circuit of claim 13, wherein the second current mirror circuit further comprises a dummy transistor connected in parallel with the mirror transistor.

15. The delay circuit of claim 14, wherein a current mirror ratio of the first current mirror circuit is K1, a current mirror ratio of the second current mirror circuit is K2, a ratio of the feedback current of the self-compensation circuit to the second mirror current is K3, a ratio of the second current to the first current is N, a size ratio of the dummy transistor to the enable transistor is K4, and the following condition is satisfied:

$$N*(1+((K2+K4)+(K2+K4))*K3)/2 > K1.$$

* * * * *